United States Patent
Tignor et al.

(10) Patent No.: US 6,535,782 B1
(45) Date of Patent: Mar. 18, 2003

(54) AUTOMATIC OPTIONING METHOD FOR PRINTED CIRCUIT BOARDS

(75) Inventors: Michael S. Tignor, Watertown, CT (US); Marshall Hart, Middletown, CT (US); LeAnne Wambolt, Plainville, CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/523,897

(22) Filed: Mar. 13, 2000

(51) Int. Cl.[7] .............................................. G06F 19/00
(52) U.S. Cl. .......................... 700/121; 700/96; 700/105
(58) Field of Search ........................... 700/95, 96, 105, 700/114–117, 121, 213–230, 180–185; 705/26–29

(56) References Cited

U.S. PATENT DOCUMENTS

| | | | | |
|---|---|---|---|---|
| 4,472,783 A | * | 9/1984 | Johnstone et al. | 700/182 |
| 4,907,190 A | * | 3/1990 | Sasaki et al. | 710/5 |
| 4,984,155 A | * | 1/1991 | Geier et al. | 705/26 |
| 5,432,702 A | * | 7/1995 | Barnett | 364/468.23 |
| 5,808,894 A | * | 9/1998 | Wiens et al. | 700/231 |
| 5,828,989 A | * | 10/1998 | Zvonar et al. | 702/188 |
| 5,880,965 A | * | 3/1999 | Nakumura et al. | 364/474.17 |
| 6,009,406 A | * | 12/1999 | Nick | 705/10 |
| 6,055,516 A | * | 4/2000 | Johnson et al. | 705/27 |
| 6,131,088 A | * | 10/2000 | Hill | 705/27 |
| 6,182,275 B1 | * | 1/2001 | Beelitz et al. | 717/1 |
| 6,338,003 B1 | * | 1/2002 | Kamiguchi et al. | 700/169 |
| 6,349,237 B1 | * | 2/2002 | Koren et al. | 700/96 |

* cited by examiner

*Primary Examiner*—Maria N. Von Buhr
(74) *Attorney, Agent, or Firm*—Cantor Colburn LLP

(57) ABSTRACT

A method and apparatus for removing a pre-determined electrical trace from a printed circuit board to manufacturing a printed circuit board with options corresponding to a specific catalog number. The apparatus comprises a computer numerically controlled milling machine control by a computer having a processor installed with a software program. The method comprises installing the software program into the computer and inputting a catalog number into the computer. The software is used to define a catalog data table that corresponds to the inputted catalog number. The catalog data table matches a cut data table whose information provides operational commands to control the movement of the cutting element of the milling machine. Once the catalog number is recognized by the processor, an operator is prompted to load the printed circuit board onto a work surface of the milling machine. Using the operational commands, the milling machine begins to mill the printed circuit board to remove the pre-determined electrical traces. When the determination is made that the pre-determined electrical trace is removed, manufacture of the printed circuit board with options is complete.

14 Claims, 3 Drawing Sheets

AUTOMATIC OPTIONING METHOD FOR PRINTED CIRCUIT BOARDS

BACKGROUND OF INVENTION

The present invention relates to a process that accurately, quickly and inexpensively modifies a standard printed circuit board in order to change the board's function. More particularly, a standard printed circuit board used in an electronic trip unit is automatically altered to change the board's function, offering an electronic trip unit having different options.

The electronics industry has expanded dramatically over the last several decades. Each year, new electronic products are introduced and previously existing products are improved. Virtually every one of these electronic products includes a printed circuit.

The requirements placed on printed circuit capabilities have increased greatly in conjunction with the constant demand for improved electronics technology. Multilayer printed circuits have literally thousands of circuitry traces. Additionally, as electronic products continue to become smaller in size, the printed circuit associated with the individual product must also decrease in size, resulting in tighter manufacturing tolerances.

There are numerous methods for manufacturing a printed circuit board, the present invention is suitable for use with any printed circuit board regardless of the manufacturing process used to produce the circuit board.

Individual printed circuit boards may be assembled to form a multilayer printed circuit board constructed by stacking a predetermined number of boards one atop another. In such a construction a cured or semi-cured polymetric non-conductive material is in contact with the copper surface of the adjacent printed circuit board. The stacked circuit board assembly may be laminated together by application of heat and pressure to form a multilayer printed circuit board.

To remain competitive, printed circuit manufacturers must keep fabrication costs as low as possible. This is an extremely difficult task, given that printed circuit manufacturing entails a number of independent processing steps. Each printed circuit board is designed and formed to serve a specific function. It is often desirable to minimally change a printed circuit to effectuate an option of the electronic product. When it is desirous to modify the function of the printed circuit board, for example, to accommodate different options for the printed circuit board, a jumper wire is often utilized. This is accomplished by adding or subtracting jumpers in an effort to alter the circuit pattern. Jumpers consist of electrical wires that are soldered in place, or if already in place then removed with cutters.

When using a multi-layer printed circuit board, several layers are laminated together so that joining electrical traces on different layers is accomplished by a lands which extends through the respective layers with a plated through hole. The leads of various components are made to penetrate through the through holes of the respective lands and are soldered to complete the electrical connection. To modify the circuit, a direct connection between two points is accomplished by soldering the jumper wire between these two points, which differs from the electrical connection made by the original wiring pattern on the substrate. This method is preformed manually so it is error prone and expensive.

There are other methods of altering the circuit patterns, such as using small dual inline package (dip) switches, which can be set and reset. Again, this is a manual operation that is error prone and expensive. Another alternative is to add integrated circuit memories that can be programmed with information that changes the circuit function. Although automatic, the use of programmable components is expensive and extra components reduce product reliability.

SUMMARY OF THE INVENTION

Due to ongoing requirements for automated processes in the manufacturing of printed circuit boards to eliminate error and the always present need to minimize cost, it is desirable to provide an assembly process that automatically and inexpensively removes electrical traces on a standard printed circuit board in order to change the board's function. The present invention provides an automated manufacturing process that takes a standard printed circuit board and removes pre-determined electrical traces to change the function of the standard printed circuit board. By removing the predetermined electrical traces, one can accurately and inexpensively offer a printed circuit board with different options.

The removal of the electrical trace is accomplished by using a computer numerically controlled (CNC) milling machine, or similar equipment capable of obtaining like results. The CNC machine, comprising a work surface and a cutting element, is activated by a personal computer preloaded with a software program designed to recognize an inputted catalog number and respond by milling the designated area on the circuit board. To utilize the process, an operator loads and secures the printed circuit board onto the work surface. The operator then inputs the catalog number, which defines the printed circuit board having the desired option, after loading the printed circuit board the automated milling process, begins and the targeted electrical traces are removed by the milling process. Upon conclusion the operator removes a modified printed circuit board from the machine.

The CNC milling machine with the cutting element in place is capable of accurately removing a copper trace without touching any adjacent traces on the same layer or touching traces on subjacent layers.

BRIEF DESCRIPTION OF THE DRAWINGS

Referring now to the drawings wherein like elements are numbered alike in the several Figures.

DETAILED DESCRIPTION OF THE INVENTION

Figure 1:
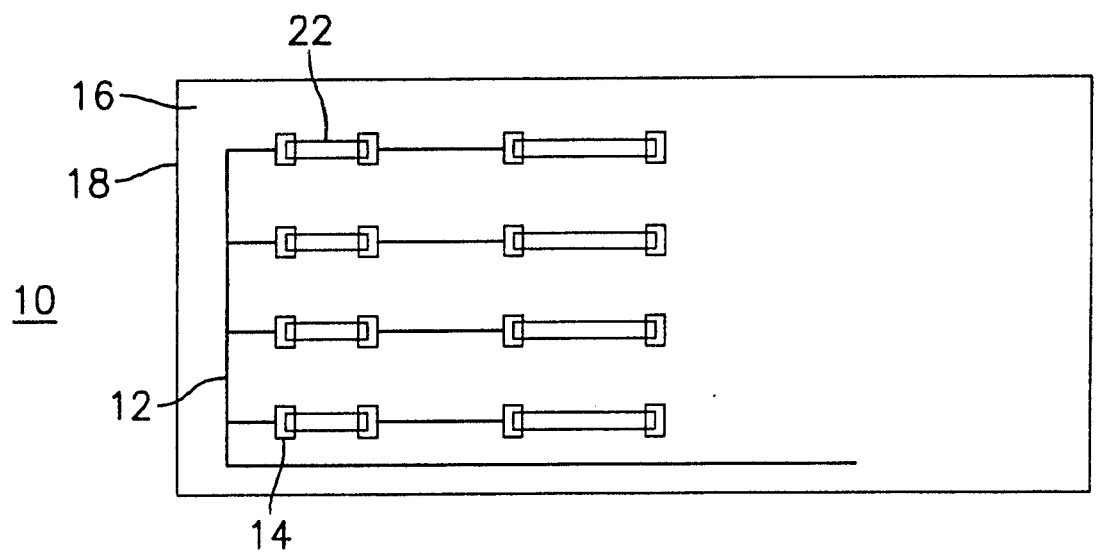
FIG. 1 is a top view of a printed circuit board prior to using the method of the present invention.
Figure 2:
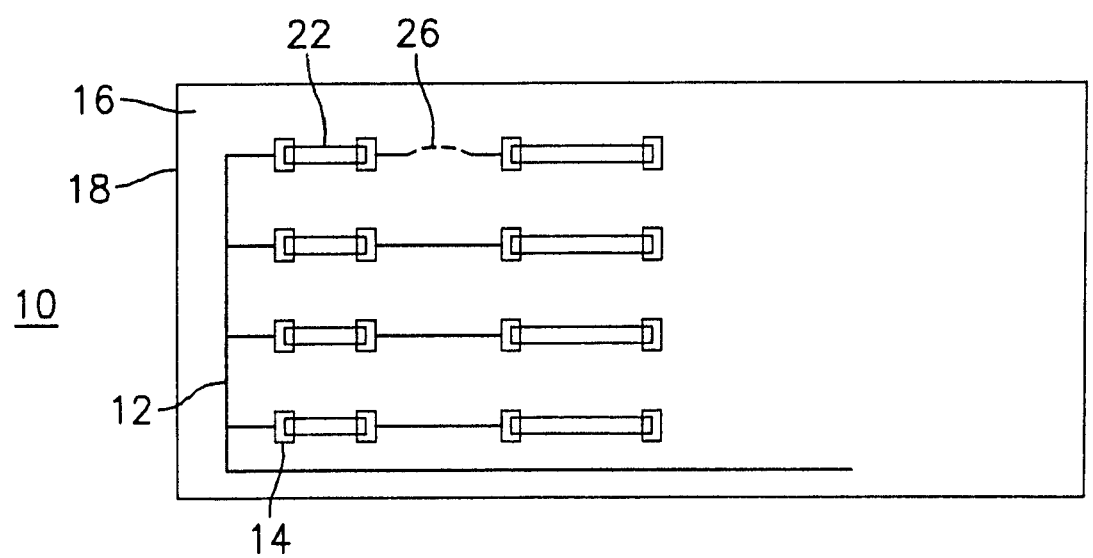
FIG. 2 is a top view of a printed circuit board after using the method of the present invention.

As illustrated in FIGS. 1 and 2, the present invention offers an automatic, reliable and inexpensive method for modifying the function of a printed circuit board 10.

FIG. 1 shows a wiring pattern that consists of a network of electrical traces 12 and a plurality of lands 14 that are formed on a surface 16 of a substrate 18. A plurality of surface mounted components 22, positioned on the plurality of lands 14, are electrically connected by the electrical traces 12.

FIG. 2 shows a pre-determined electrical trace 26 that is designated for removal. The method for removing the pre-determined electrical trace 26 will be described later in detail. Once the pre-determined electrical trace 26 is removed, the circuit is altered in a manner that would create a functionally different version of the circuit on the same printed circuit board 10.

Figures 3, 4, 5:
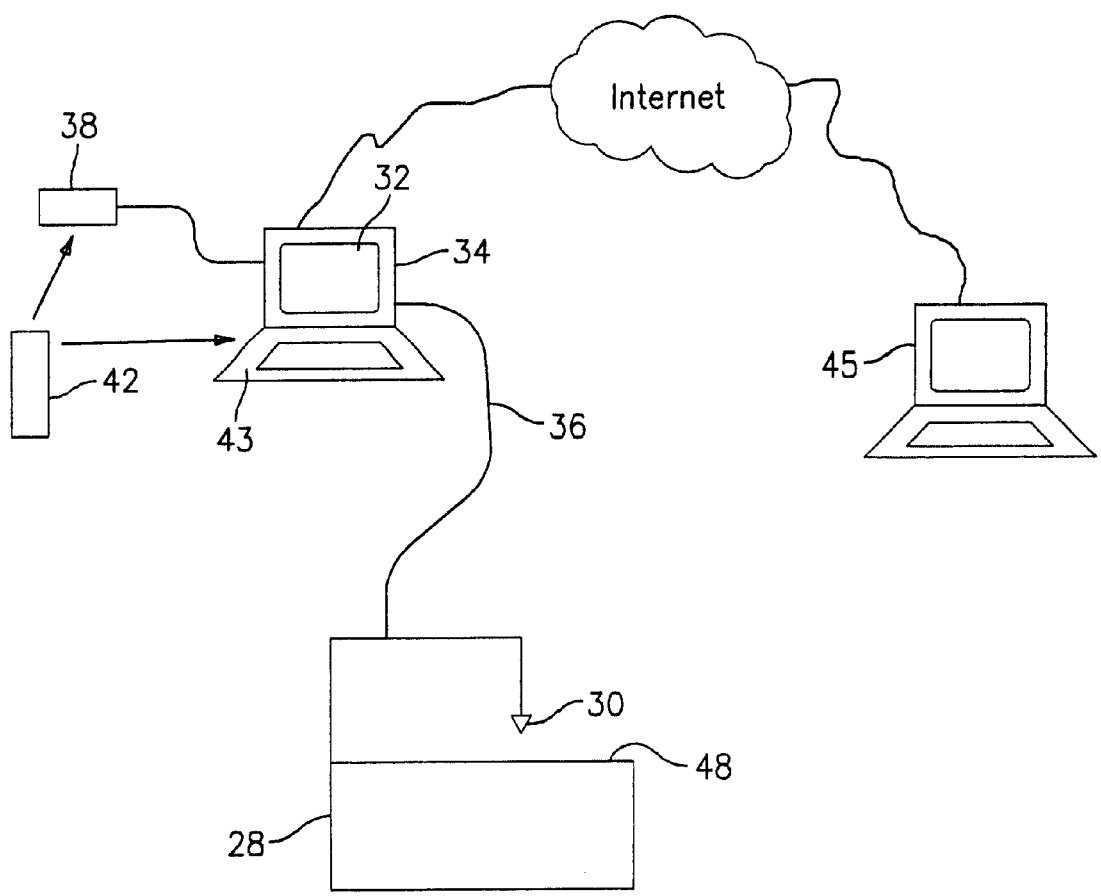
FIG. 3 is a generalized layout of the equipment for implementing the method of the present invention.
FIG. 4 is a portion of a catalog data table of the present invention.
FIG. 5 is a portion of a cut data table of the present invention.
Figure 6:
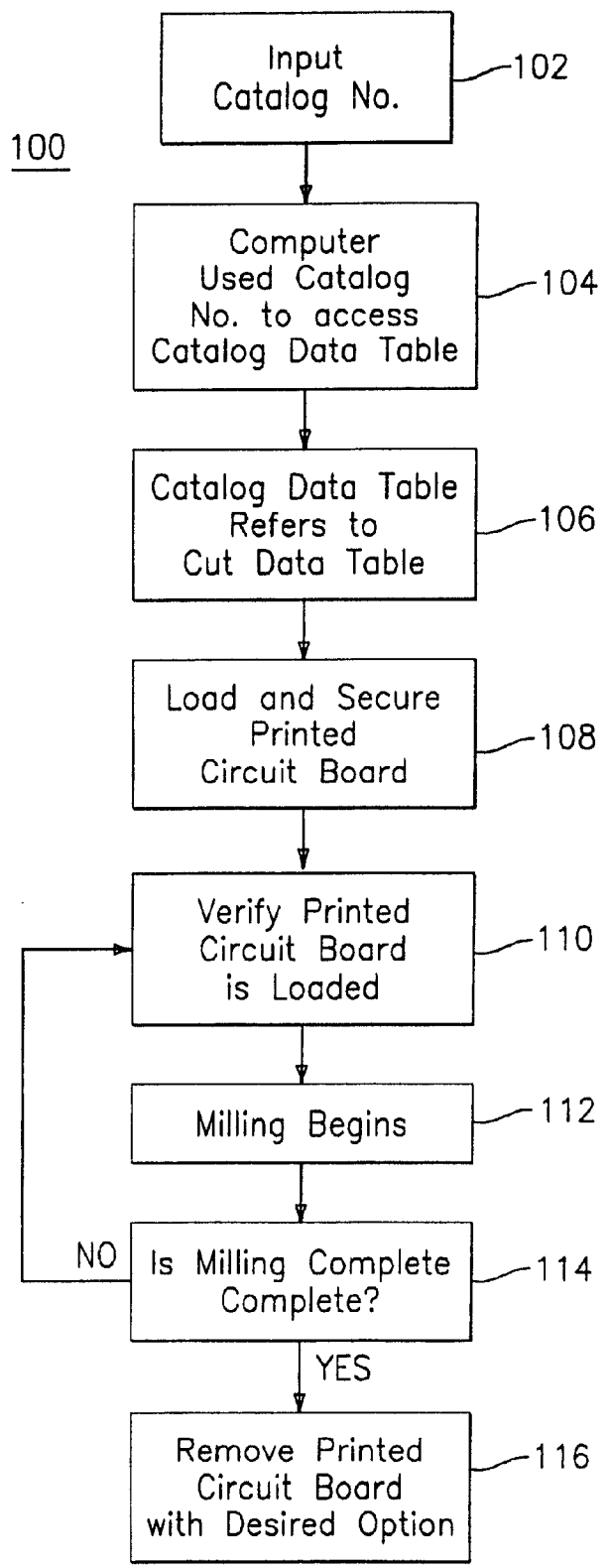
FIG. 6 is a flowchart representative of the method of the present invention.

The equipment needed to remove the predetermined electrical trace 26 is shown in FIG. 3. Removal of the pre-determined electrical trace 26 is accomplished by following a method that utilizes a computer numerically controlled (CNC) milling machine 28, having a cutting element 30, which is controlled by a software program 32 installed in a computer 34. The software program 32 is written to control the movement of cutting element 30. The computer 34 is interconnected to the CNC milling machine 28 with an appropriate cabling system 36. The computer 34 includes a storage medium for storing the software program 32 and various data tables, a processor for executing the program 32, a keyboard 43 for providing manual input to the processor, and a modem or network card for communicating with a remote computer 45 via the Internet or a local network. Optional equipment includes a scanner 38 which, if used, is connected to the computer 34.

Following the method results in the removal of the pre-determined electrical trace 26 and the creation of the printed circuit board with desired option 24. Different options are produced by removing different electrical traces 26. A catalog number 40 is assigned to a circuit board having one or more predetermined options. Different catalog numbers have different options, allowing a customer to order a circuit board with a particular set of options 24 by simply referring to the catalog number 40.

When the computer 34, having the software program 32 installed, is configured to the CNC milling machine 28 an operator 42 is ready to begin the method which will remove the predetermined electrical traces 26 from the printed circuit board 10. Following the method steps indicated at (100) in FIG. 7, the operator 42 begins by inputting the catalog number 40 into the personal computer 34 (102). The operator 42 input can be conducted manually by typing the catalog number 40 using the keyboard 43 or automatically by scanning the catalog number 40, ideally located on the printed circuit board 10, with the scanner 38.

Referring to FIGS. 4 and 5, once the appropriate catalog number 40 is registered by the computer 34, the processor running the software 32 looks up the catalog number 40 on a catalog data table 44 (104). The catalog data table 44 being a table having all of the catalog numbers 40 and their options listed in table format. The catalog data table 44 may be stored within the computer's memory or may be stored on a remote computer 45 and accessed via the Internet or via a local network. Next, the catalog data table 44 refers to a cut data table 46 (106) that is stored either locally in the computer 34 or remotely in the computer 45 and accessed via the internet or via the local network. The cut data table 46 defines which of the pre-determined electrical traces 26 need to be removed to produce the selected options. Each catalog number 40 has a matching entry on the catalog data table 44 and each entry on the entry on the catalog data table 44 has a matching entry on the cut data table 46. It is the entry on the cut data table 46 that provides operational commands to direct the cutting element 30, of the CNC machine 28, so that the correct pre-determined electrical trace 26 is removed.

The operator 42 is prompted to load the printed circuit board 10 onto a work surface 48 that can be an extension of the CNC machine 28 (108). The operator 42 is then prompted, through the computer 34, to verify that the printed circuit board 10 is properly loaded (110). Once this occurs the cutting element 30 of the CNC machine 28 begins to mill the area on the printed circuit board 10 containing the pre-determined electrical traces 26 that are to be removed (112). The commands provided by the software program 32 will precisely direct the CNC machine 28 to mill the electrical traces 28 without touching any bordering electrical traces 14. This is achieved by the monitoring of movement of the cutting element 30 in the x and y planes. Additionally, the program 32 precisely controls the depth to which the milling process occurs, while preventing contact with any subjacent electrical traces 14 located on other layers of a multi-layered board. This is achieved by the monitoring of the movement of the cutting element 30 in the z plane.

When the first milling pass is complete the determination will be made if the pre-determined electrical trace 26 is removed (114), if not, the operator 42 is instructed to reload the printed circuit board 10 and the milling process is repeated (110, 112). When the determination is made that the pre-determined electrical trace 26 is properly removed, the operator 42 will be prompted to remove the printed circuit board with options 24 from the work surface 48 of the CNC machine 28 (116).

This invention describes the method for removing pre-determined electrical traces 26 from an outside layer of the multi-layer printed circuit board. This method can be used with single or multi-layer printed circuit boards. This method uses a generic printed circuit board 10, which includes electrical traces 12 for all available options and all catalog numbers. Therefore, a supplier need only stock one type of circuit board 10 and can fill a clients order for a circuit board having a particular catalog number on demand. Therefore, the invention eliminates the need to stock a number of circuit boards for each catalog number 40. An additional advantage is the ability to store the catalog data table 44 and the cut data table 46 remotely and access them through the Internet or local network. By storing data remotely, the catalog data table 44 and the cut data table 46 can be centrally updated and controlled for a number of suppliers. The method is automated so that error and cost are minimized thereby providing an accurate and inexpensive method for producing the printed circuit board with desired options 24.

It will be understood that a person skilled in the art may make modifications to the preferred embodiment shown herein within the scope and intent of the claims. While the present invention has been described as carried out in a specific embodiment thereof, it is not intended to be limited thereby but is intended to cover the invention broadly within the scope and spirit of the claims.

What is claimed is:

1. A method for manufacturing a printed circuit board with options corresponding to a specific catalog number, the method comprising;

inputting the catalog number into a computer, determining a catalog data table corresponding to the catalog number, determining a cut data table corresponding to the catalog data table, using commands for the cut data table to control the movement of a cutting element of a computer numerically controlled machine to remove a pre-determined electrical trace from the printed circuit board.

2. The method of claim 1 wherein said inputting the catalog number comprises typing the catalog number on a keyboard.

3. The method of claim 1 wherein said inputting the catalog number comprises scanning the catalog number using a scanner.

4. The method of claim 1 wherein the catalog data table or the cut data table is provided via the Internet.

5. The method of claim 1 wherein the catalog data table or the cut data table is provided via a local network.

6. The method of claim 1 wherein the catalog data table and the cut data table are provided via the Internet.

7. The method of claim 1 wherein the catalog data table and the cut data table are provided via a local network.

8. An apparatus for removing a predetermined electrical trace from a printed circuit board to produce a printed circuit board with options corresponding to a specific catalog number, the apparatus comprising;

a processor, a computer storage medium comprising data to cause the processor to recognize a catalog number representative of one or more options and using the one or more options to select at least one corresponding command from a cut data table, a computer numerical controlled machine comprising a cutting element arranged to receive the corresponding commands wherein the computer numerically controlled machine uses the corresponding commands to control the movement of the cutting element.

9. The apparatus of claim 8 wherein the computer storage medium further comprises;

a keyboard used to manually input the catalog number into the processor.

10. The apparatus of claim 8 further comprises;

a scanner used to automatically input the catalog number into the processor.

11. The apparatus of claim 8 wherein the computer numerically controlled machine is a milling machine.

12. The apparatus of claim 11 wherein the movement of the cutting element is controlled in the x, y and z planes.

13. The apparatus of claim 8 wherein the cut data table is stored remotely and accessed via the Internet.

14. The apparatus of claim 8 wherein the catalog data table is stored remotely and accessed via a local network.

\* \* \* \* \*